United States Patent
Hovakimyan (10) Patent No.: US 6,801,582 B2
(45) Date of Patent: Oct. 5, 2004

(54) APPARATUS AND METHOD FOR IMPROVING AN OUTPUT SIGNAL FROM A NONLINEAR DEVICE THROUGH DYNAMIC SIGNAL PRE-DISTORTION BASED UPON LAGRANGE INTERPOLATION

(75) Inventor: Karen Hovakimyan, Sunnyvale, CA (US)

(73) Assignee: Allied Telesyn, Inc., Bothell, WA (US)

( * ) Notice: Subject to any disclaimer, the term of this patent is extended or adjusted under 35 U.S.C. 154(b) by 79 days.

(21) Appl. No.: 10/244,038

(22) Filed: Sep. 13, 2002

(65) Prior Publication Data

US 2004/0052313 A1 Mar. 18, 2004

(51) Int. Cl.[7] ............................................. H04L 25/03
(52) U.S. Cl. ....................... 375/296; 375/285; 455/63.1
(58) Field of Search ................................. 375/219, 222, 375/284, 285, 295, 296, 297; 455/63.1, 63.2, 126; 332/123, 124, 159, 160, 162

(56) References Cited

U.S. PATENT DOCUMENTS

| | | | |
|---|---|---|---|
| 4,291,277 A | | 9/1981 | Davis et al. |
| 4,462,001 A | | 7/1984 | Girard |
| 4,700,151 A | | 10/1987 | Nagata |
| 5,105,445 A | * | 4/1992 | Karam et al. ............... 375/296 |
| 5,107,520 A | | 4/1992 | Karam et al. |
| 6,003,055 A | * | 12/1999 | Kanazuka .................... 708/312 |
| 6,072,364 A | * | 6/2000 | Jeckeln et al. ............... 330/149 |
| 6,081,158 A | * | 6/2000 | Twitchell et al. ............ 330/149 |
| 6,236,837 B1 | | 5/2001 | Midya |
| 6,600,792 B2 | * | 7/2003 | Antonio et al. .............. 375/297 |
| 2003/0179830 A1 | * | 9/2003 | Eidson et al. ................ 375/296 |

OTHER PUBLICATIONS

Karam, et al., "Analysis of Predistortion, Equalization, and ISI Cancellation Techniques in Digital Radio Systems with Nonlinear Transmit Amplifiers," *IEEE Transactions on Communications*, vol. 37, No. 12, Dec. 1989, pp. 1245–1253.

Di Benedetto, et al., "An Application of MMSE Predistortion to OFDM Systems," *IEEE Transactions on Communications*, vol. 44, No. 11, Nov. 1996, pp. 1417–1420.

Kang, et al., "On Compensation Nonlinear Distortions of an OFDM System Using an Efficient Adaptive Predistorter," *IEEE Transactions on Communications*, vol. 47, No. 4, Apr. 1999, pp. 522–526.

D' Andrea, "Nonlinear Predistortion of OFDM Signals Over Frequency–Selective Fading Channels," *IEEE Transactions on Communications*, vol. 49, No. 5, May 2001, pp. 837–843.

* cited by examiner

*Primary Examiner*—Chieh M. Fan
(74) *Attorney, Agent, or Firm*—Cooley Godward LLP (57) ABSTRACT

An apparatus for pre-distorting a signal includes input nodes to receive an in-phase input signal and a quadrature input signal. Feedback nodes receive an in-phase feedback signal and a quadrature feedback signal. Output nodes transmit an in-phase pre-distorted signal and a quadrature pre-distorted signal. A Lagrange interpolation digital pre-distortion circuit is connected to the input nodes, the feedback nodes, and the output nodes. The Lagrange interpolation digital pre-distortion circuit is configured to perform a Lagrange interpolation on the in-phase input signal, the quadrature input signal, the in-phase feedback signal, and the quadrature feedback signal to produce the in-phase pre-distorted signal and the quadrature pre-distorted signal.

10 Claims, 9 Drawing Sheets

APPARATUS AND METHOD FOR IMPROVING AN OUTPUT SIGNAL FROM A NONLINEAR DEVICE THROUGH DYNAMIC SIGNAL PRE-DISTORTION BASED UPON LAGRANGE INTERPOLATION

BRIEF DESCRIPTION OF THE INVENTION

This invention relates generally to signal processing. More particularly, this invention relates to a dynamic signal pre-distortion technique utilizing Lagrange interpolation to improve data output from a nonlinear device.

BACKGROUND OF THE INVENTION

Signal distortion produced by nonlinear devices, such as high-powered amplifiers, is an ongoing problem. Nonlinear devices commonly distort a signal and cause spectral side lobes. It is known to compensate for a nonlinear device by pre-distorting the signal processed by the nonlinear device. The pre-distortion is generally in the form of an inverse function of the nonlinear device. Since operating device temperature and aging may cause the nonlinear function to change with time, the pre-distortion should adapt in a dynamic manner to account for these varying conditions.

Many existing pre-distortion schemes operate through the use of look-up tables. That is, the inverse function to provide the requisite pre-distortion is produced from a look-up table that has pre-distortion output signals for a set of input signals. The problem with this approach is that if the amplitude deviation of the input signal is large, the memory required to implement the look-up table is large. This results in additional system expense and also precludes efficient dynamic updates of look-up table values.

In view of the foregoing, it would be highly desirable to provide an improved technique for compensating for nonlinear devices. More particularly, it would be highly desirable to provide a dynamic pre-distortion technique that does not rely upon look-up tables and otherwise operates to quickly provide dynamic pre-distortion for a nonlinear device.

SUMMARY OF THE INVENTION

The invention includes an apparatus for pre-distorting a signal. The apparatus includes input nodes to receive an in-phase input signal and a quadrature input signal. Feedback nodes receive an in-phase feedback signal and a quadrature feedback signal. Output nodes transmit an in-phase pre-distorted signal and a quadrature pre-distorted signal. A Lagrange interpolation digital pre-distortion circuit is connected to the input nodes, the feedback nodes, and the output nodes. The Lagrange interpolation digital pre-distortion circuit is configured to perform a Lagrange interpolation on the in-phase input signal, the quadrature input signal, the in-phase feedback signal, and the quadrature feedback signal to produce the in-phase pre-distorted signal and the quadrature pre-distorted signal.

The invention also includes a method of pre-distorting a signal. The method includes receiving an in-phase input signal, a quadrature input signal, an in-phase feedback signal, and a quadrature feedback signal. A Lagrange interpolation is performed on the in-phase input signal, the quadrature input signal, the in-phase feedback signal, and the quadrature feedback signal to produce an in-phase pre-distorted signal and a quadrature pre-distorted signal.

The invention provides dynamic pre-distortion without the expense and performance shortcomings associated with look-up tables. The Lagrange interpolation polynomials utilized in accordance with the invention approximate an inverse distortion function with a small number of data points. This approach allows for a dynamic update of sampling points and the interpolation of data between data points.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
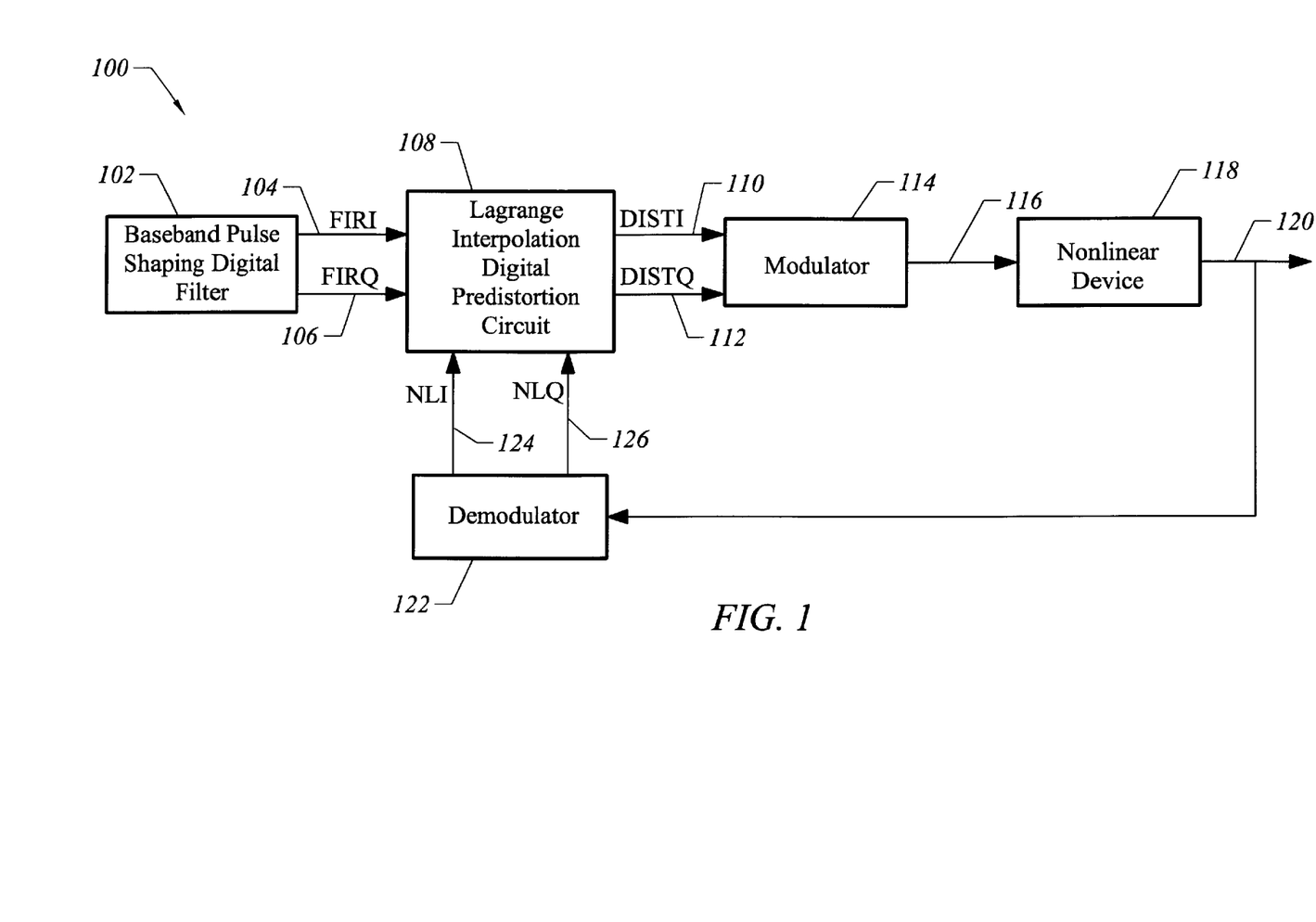
FIG. 1 illustrates a nonlinear system compensated through dynamic signal pre-distortion using Lagrange interpolation in accordance with an embodiment of the invention.

FIG. 1 illustrates a nonlinear system 100 with dynamic signal pre-distortion using Lagrange interpolation. The system 100 includes a base band pulse shaping digital filter 102, which produces an in-phase input signal (FIRI) on node 104 and a quadrature input signal (FIRQ) on node 106. A Lagrange interpolation digital pre-distortion circuit 108 processes the in-phase input signal and quadrature input signal, along with an in-phase-feedback signal (NLI) and a quadrature feedback signal (NLQ) to produce an in-phase pre-distorted signal (DISTI) on node 110 and a quadrature pre-distorted signal (DISTQ) on node 112. The in-phase pre-distorted signal and quadrature pre-distorted signal constitute an inverse function of the distortion that the signals will subsequently experience, and thereby compensate for the distortion.

The in-phase pre-distorted signal (DISTI) and the quadrature pre-distorted signal (DISTQ) are applied to a modulator 114, and then via node 116, to a nonlinear device 118, such as a high-power amplifier, which introduces signal distortion. The output from the nonlinear device 118 on node 120 is fed back to a demodulator 122, which produces an in-phase feedback signal (NLI) on node 124 and a quadrature feedback signal (NLQ) on node 126.

The non-linear system 100 of FIG. 1 is exemplary. Those skilled in the art will appreciate that the Lagrange interpolation digital pre-distortion circuit 108 may be incorporated into other nonlinear systems.

Figure 2:
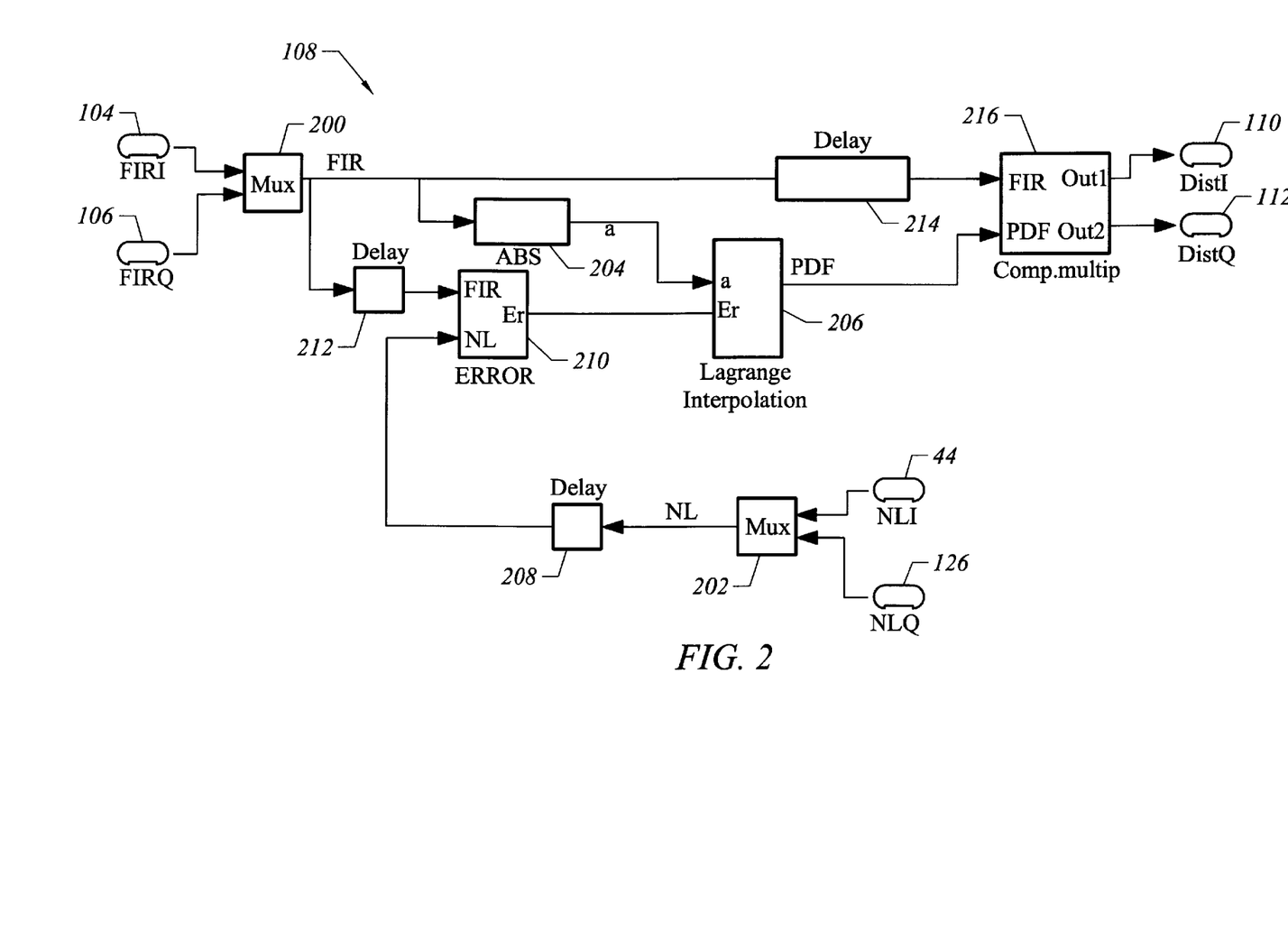
FIG. 2 illustrates a Lagrange interpolation digital pre-distortion circuit implemented in accordance with an embodiment of the invention.

FIG. 2 illustrates an embodiment of the Lagrange interpolation digital pre-distortion circuit 108. The figure illustrates input nodes 104 and 106 to respectively receive the in-phase input signal (FIRI) and quadrature input signal (FIRQ), feedback nodes 124 and 126 to respectively receive the in-phase feedback signal (NLI) and the quadrature feedback signal (NLQ), and output nodes 110 and 112 to respectively transmit the in-phase pre-distorted signal (DISTI) and the quadrature pre-distorted signal (DISTQ).

A filter multiplexer 200 may be used to process the in-phase input signal and the quadrature input signal. The output from the multiplexer 200 is illustrated as a single complex input signal (FIR) to simplify the drawing. It should be appreciated that the in-phase and quadrature components of all signals processed in accordance with the invention can be represented as a single complex signal received at a single link. Therefore, references to separate links or nodes to process the in-phase and quadrature signal components are for clarity of explanation and should not be viewed as a limiting aspect of the invention.

The complex input signal is applied to an absolute value circuit 204 to produce an absolute value input signal, which is applied to a Lagrange interpolation circuit 206. The complex input signal is also applied to a delay circuit 212 and then to an error circuit 210. The error circuit 210 processes the complex input signal and a complex feedback signal. In particular, the in-phase feedback signal (NLI) and quadrature feedback signal (NLQ) from nodes 124 and 126 are applied to feedback multiplexer 202. The output from the multiplexer 202 is illustrated as a single complex feedback signal (NL), which is applied to a delay circuit 208 and then to the error block 210. The error block 210 produces an error signal representative of the error between the in-phase input signal and the in-phase feedback signal and between the quadrature input signal and quadrature feedback signal. In one embodiment of the invention, the error is calculated as the ratio of the complex input signal and the complex feedback signal:

$$(e1, e2) = (FIRI, FIRQ)/(NLI, NLQ) \quad \text{Equation 1.}$$

In this case, the desired value for the error ratio is complex unity (1,0). Preferably, this value is modified with a gain value:

$$Er = gain*[(e1, e2)-(1,0)] \quad \text{Equation 2.}$$

The error signal Er is passed to the Lagrange interpolation circuit 206.

The Lagrange interpolation circuit 206 produces a complex multiplication term (PDF) based upon the error signal (Er) and the complex input signal "a". The Lagrange interpolation circuit provides a multiplication factor for each input amplitude "a" and then modifies these factors depending upon the error (Er). In accordance with the invention, Lagrange polynomials are utilized to implement this functionality.

Assume that the range of complex input signal (FIR) amplitudes is (0–1). The Lagrange interpolation circuit provides optimal values (PDF) for each input amplitude "a". Assume that optimal values of PDF are known for particular values denoted by $a_1, a_2 \ldots a_m$, and corresponding PDF values are $PDF_1, \ldots, PDF_m$. Then there exists an m−1 order polynomial (Lagrange polynomial):

$$PDF(a) = \sum_{i=1}^{m} PDF_i \prod_{\substack{k=1 \\ k \neq i}}^{m} \frac{a - a_k}{a_k - a_i} \quad (1)$$

$$= PDF_1 \cdot \left( \frac{(a-a_2)\cdot(a-a_3)\cdot(a-a_4)\cdot(a-a_5)\cdot(a-a_6)}{(a_2-a_1)\cdot(a_3-a_1)\cdot(a_4-a_1)\cdot(a_5-a_1)\cdot(a_6-a_1)} \right) +$$

$$PDF_2 \cdot$$

$$\left( \frac{(a-a_1)\cdot(a-a_3)\cdot(a-a_4)\cdot(a-a_5)\cdot(a-a_6)}{(a_1-a_2)\cdot(a_3-a_2)\cdot(a_4-a_2)\cdot(a_5-a_2)\cdot(a_6-a_2)} \right) + \ldots +$$

$$PDF_6 \cdot \left( \frac{(a-a_1)\cdot(a-a_2)\cdot(a-a_3)\cdot(a-a_4)\cdot(a-a_5)}{(a_1-a_6)\cdot(a_2-a_6)\cdot(a_3-a_6)\cdot(a_4-a_6)\cdot(a_5-a_6)} \right)$$

(Equation 3)
which passes through these m points, that is $PDF(a_1)=PDF_1, \ldots, PDF(a_m)=PDF_m$. The order of the polynomial defines the complexity and accuracy of the pre-distortion circuit. In an example provided below, m=6 and one may choose $a_1$ equally spaced: $a_1 = 0, a_2 = 0.2, a_3 = 0.4, a_4 = 0.6, a_5 = 0.8, a_6 = 1$; however, the other choice of $a_i$ may be preferable depending particular characteristics of nonlinearity. The initial values of PDF can be set as $PDF_1 = PDF_2 = \ldots = PDF_6 = (1,0)$ expecting that optimal values of $PDF_1, \ldots, PDF_6$ will be established during adaptation processes discussed in connection with FIGS. 5 and 6.

For a given value of an amplitude of a complex input signal "a" the Lagrange interpolation circuit produces the value PDF(a) calculated according to Equation 3. The calculation of Equation 3 requires the values of PDF1, ..., PDF6. These values are the outputs of a coefficient adjustment circuit discussed below. These values are adjusted recursively based on the error, Er, defined by Equation 2. Given input amplitude "a", the modified value of PDFi at the n-th sampling instant is derived recursively from the corresponding value at the n−1-th step by:

$$PDF_i(n) = PDF_{1,}(n-1)*[(1,0) + Er*g(a,i)] \quad \text{Equation 4}$$

where $$g(a,i) = \text{sat}[1 - \text{abs}[(a-a_i)/(a_{i+1}-a_i)]] \quad \text{Equation 5}$$

where $$\text{sat}[x] = x, \text{ if } x >= 0 \text{ and sat}[x] = 0, \text{ otherwise} \quad \text{Equation 6.}$$

The gain parameter "g" trades off the speed and precision of Lagrange polynomial adjustment process. In accordance with this embodiment of the invention, the coefficients $PDF(a_i)$ and $PDF(a_{i+1})$ are adjusted at each sampling time with an adjustment weight proportional to the distance between current value a and nearest two values $a_i$ and $a_{i+1}$, as provided by Equation 5. The number of multiplications and divisions required given interpolation polynomial degree m can estimate the complexity of a predistorter scheme.

The complex multiplication term produced by the Lagrange interpolation circuit 206 is applied to a complex multiplier circuit 216. The complex multiplier circuit 216 receives the complex multiplication term and a delayed version of the complex input signal to produce an in-phase pre-distorted signal (DISTI) and a quadrature pre-distorted signal (DISTQ). As previously indicated, these signals compensate for the distortion introduced by the nonlinear device 118.

Figure 3:
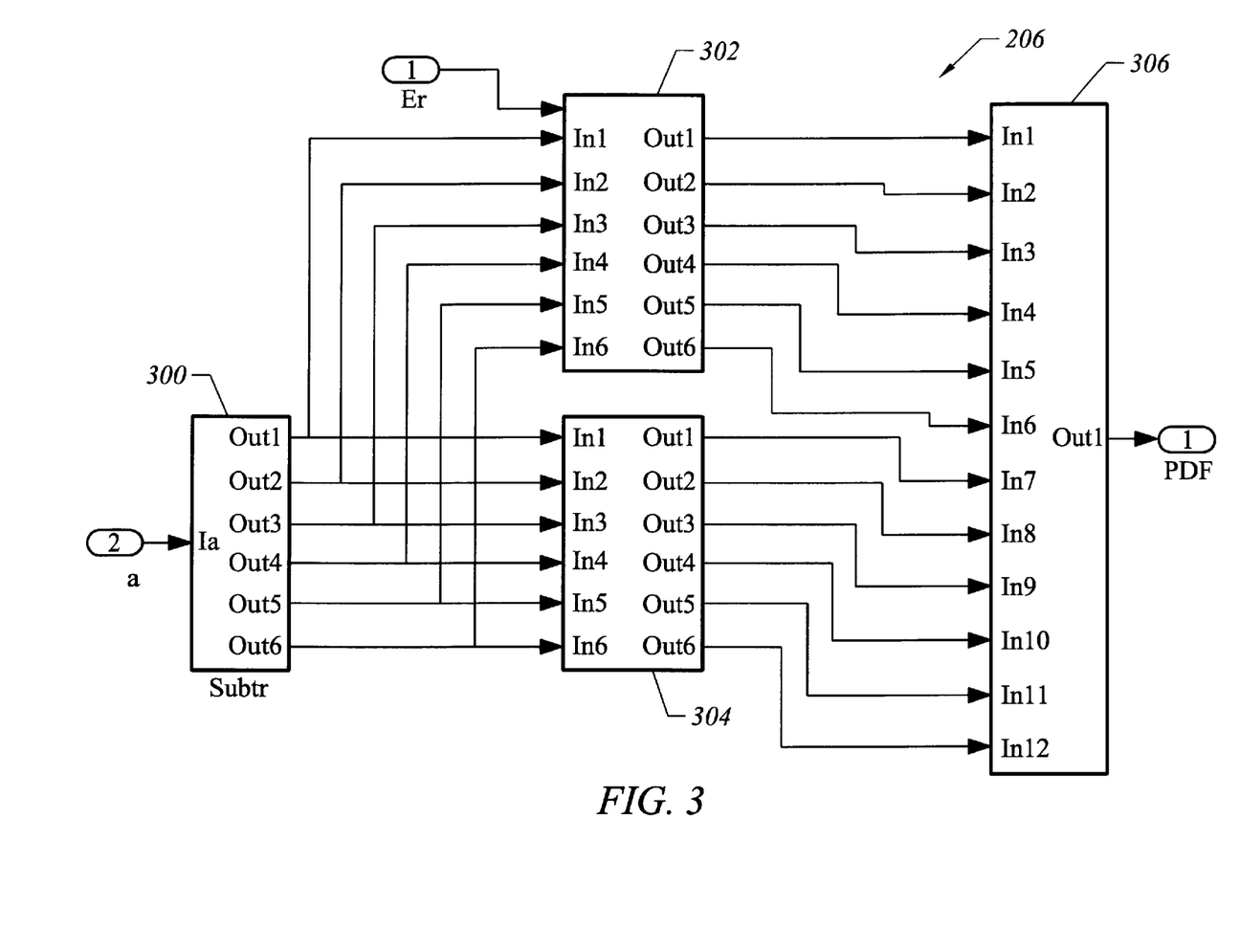
FIG. 3 illustrates a Lagrange interpolation module implemented in accordance with an embodiment of the invention.

FIG. 3 illustrates an embodiment of the Lagrange interpolation circuit 206. In one embodiment, the Lagrange interpolation circuit 206 includes an input differencing circuit 300 to generate input signal difference values from the absolute value of the complex input signal. The input signal difference values are of the form $(a_x-a_y)$, as shown in Equation 3. The input signal difference values are applied to a coefficient adjustment circuit 302, which produces a recursive complex multiplication term. The coefficient adjustment circuit 302 produces the recursive complex multiplication term as a function of the complex multiplication term of a prior sample, an error signal, and a gain factor defined accordance with a saturation function. Equation 4 models the functionality of the coefficient adjustment circuit 302.

The input signal difference values are also applied to a quotient circuit 304, which produces quotient values. The quotient values correspond to the numerator and denominator values of Equation 3.

The recursive complex multiplication terms from the coefficient adjustment circuit 302 and the quotient values from the quotient circuit 304 are applied to an interpolation circuit 306, which produces a complex multiplication term. The complex multiplication term is the PDF(a) value of Equation 3.

As previously indicated, the complex multiplication term is multiplied by the in-phase input signal and the quadrature input signal to produce the in-phase pre-distorted signal and the quadrature pre-distorted signal, as shown in FIG. 2.

Figure 4:
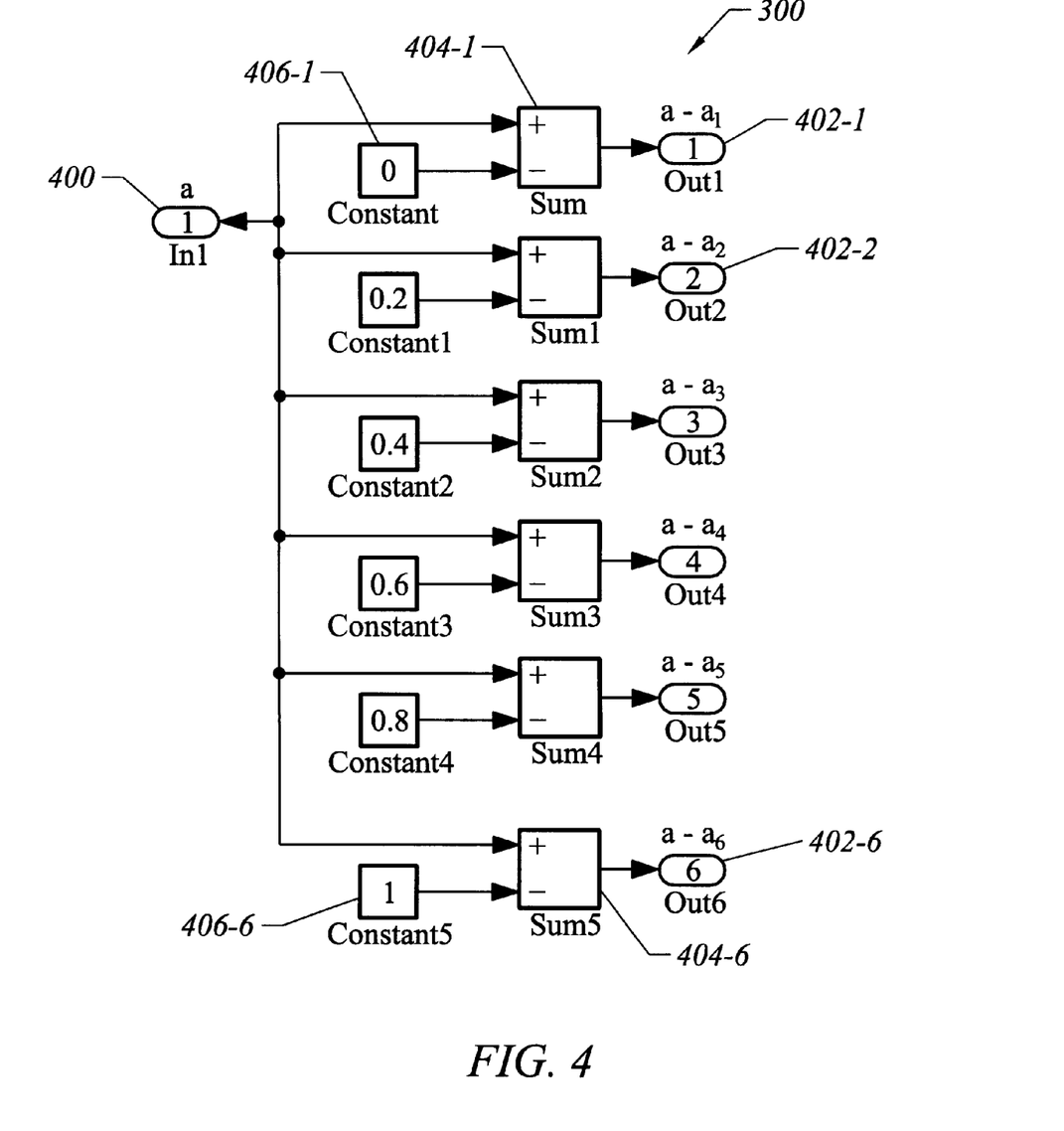
FIG. 4 illustrates an input signal differencing circuit that may be utilized in accordance with the module of FIG. 3.

FIG. 4 illustrates an embodiment of the input signal differencing circuit 300. As previously indicated, the input signal differencing circuit 300 generates input signal difference values from the absolute value of the in-phase input signal and the quadrature input signal, illustrated as signal "a" in the figures. In this example, the signal "a" is compared to m=6 constant values, shown as 0, 0.2, 0.4, 0.6, 0.8, and 1. Summing circuits 404_1 through 404_6 take the difference between the input signal "a" and a specified constant value to generate a set of input signal difference values on nodes 402_1 through 402_6.

Figure 5:
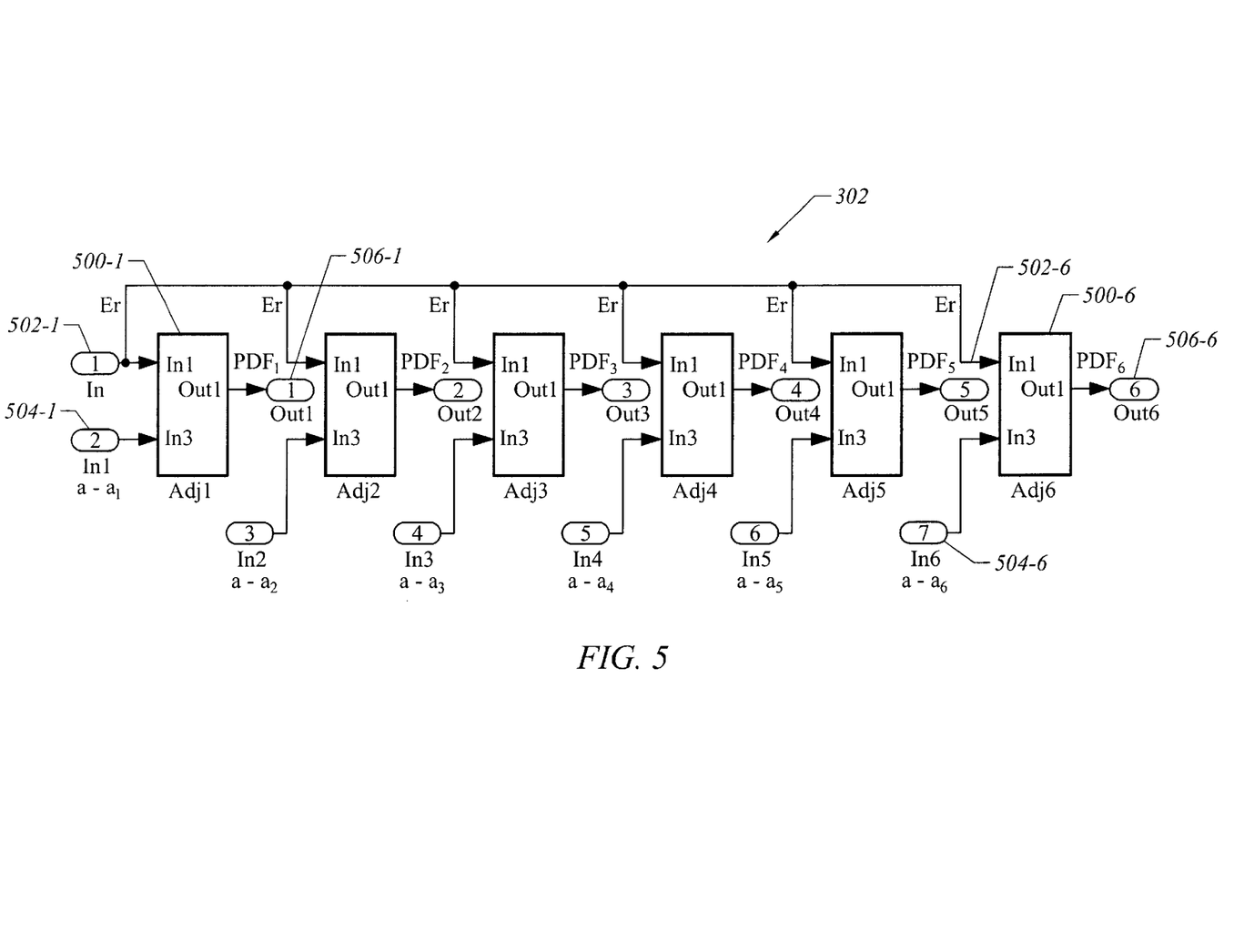
FIG. 5 illustrates a Lagrange coefficient adjustment module that may be utilized in accordance with the module of FIG. 3.

FIG. 5 illustrates a Lagrange coefficient adjustment unit 302 configured in accordance with an embodiment of the invention. The Lagrange coefficient adjustment unit 302 performs operations corresponding to Equation 4 to produce a set of recursive complex multiplication terms $PDF_i$, which are processed in accordance with Equation 3. FIG. 5 illustrates a set of Lagrange coefficient adjustment units 500_1 through 500_6, which receive error signals on nodes 502_1 through 502_6 and input signal difference values on nodes 504_1 through 504_6. Recursive complex multiplication terms $PDF_i$ are produced on nodes 506_1 through 506_6.

Figure 6:
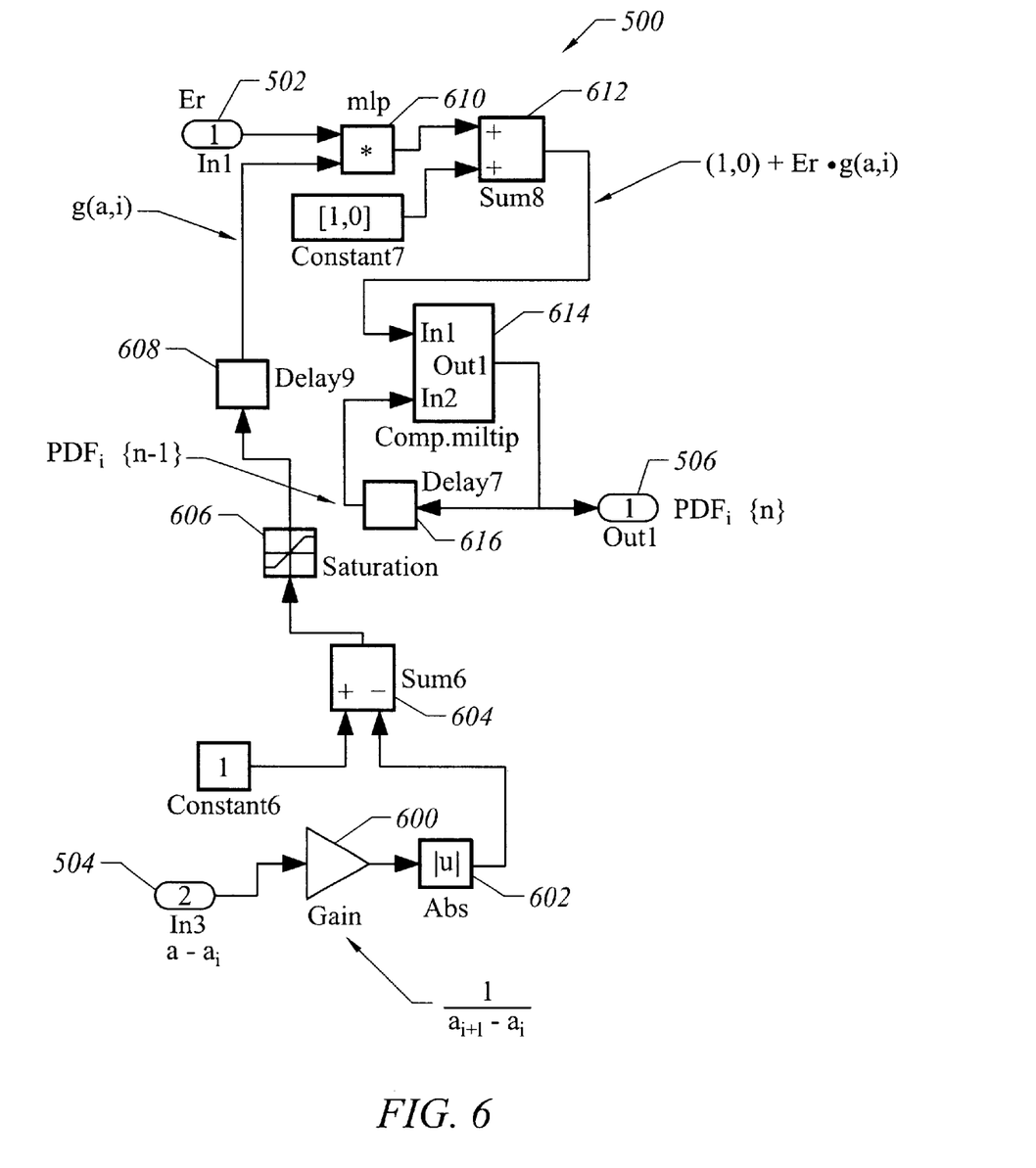
FIG. 6 illustrates a Lagrange coefficient adjustment unit that may be utilized in accordance with the module of FIG. 5.

FIG. 6 illustrates an embodiment of a Lagrange coefficient adjustment unit 500. Input signal difference values are received on node 504. A gain block 600 applies a gain of $1/(a_{i+1}-a_i)$ to the input signal difference values $(a-a_i)$, thereby producing $(a-a_i)/(a_{i+1}-a_i)$, which is applied to an absolute value block 602, thereby producing the absolute value term of Equation 5. This absolute value term is then subtracted from a constant value at block 604 and is then subject to a saturation function at block 606. The saturation function of block 606 may be implemented utilizing the saturation function of Equation 6. The output from the saturation block 606 is delayed with delay block 608 and is then multiplied at block 610 with the error signal from node 502. The summing block 612 is then used to add the constant value (1,0), thereby producing the (1,0)+Er*g(a,i) term of Equation 4. This term is then multiplied at block 614 by a $PDF_i$ value from a previous sample. Delay block 616 is used to generate this $PDF_i$ previous sample denoted $PDF_i(n-1)$. This produces the $PDF_i(n)$ term of equation 4.

Figure 7:
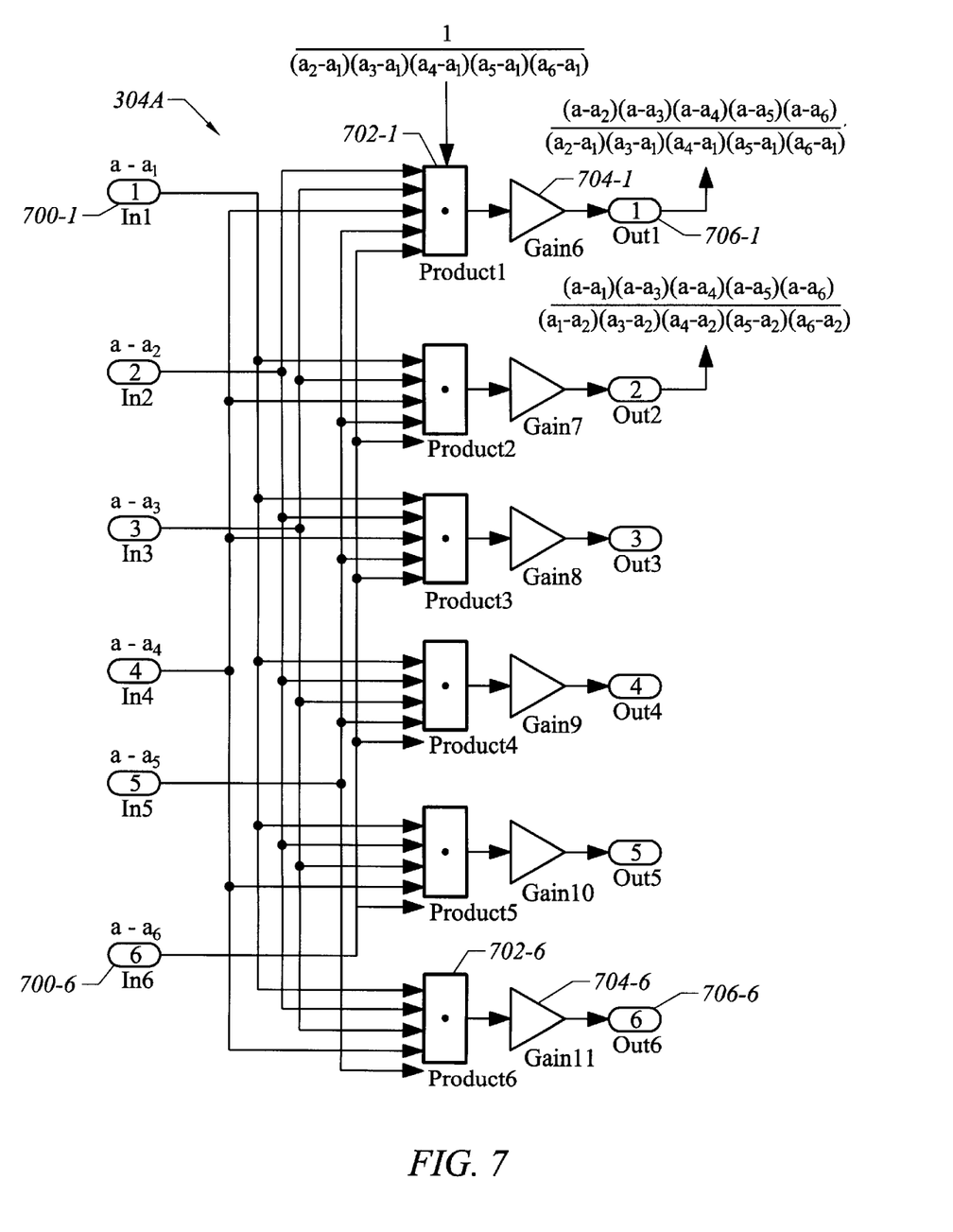
FIG. 7 illustrates a quotient circuit that may be utilized in accordance with the module of FIG. 3.

FIG. 7 illustrates a quotient circuit 304A that may be implemented in accordance with an embodiment of the invention. The quotient circuit 304A processes input signal difference values to produce quotient values. FIG. 7 illustrates inputs nodes 700_1 through 700_6 receiving input signal difference values. Product blocks 702_1 through 702_6 produce numerator terms, which are applied to gain blocks 704_1 through 704_6. The gain blocks provide fixed denominator terms, an example of which is shown in connection with gain block 704_1. Each output pin 706_1 through 706_6 carries a numerator-denominator expression required by Equation 3. Output pins 706_1 and 706_2 illustrate two examples of such expressions in accordance with an embodiment of the invention. These expressions result in quotient values.

Figure 8:
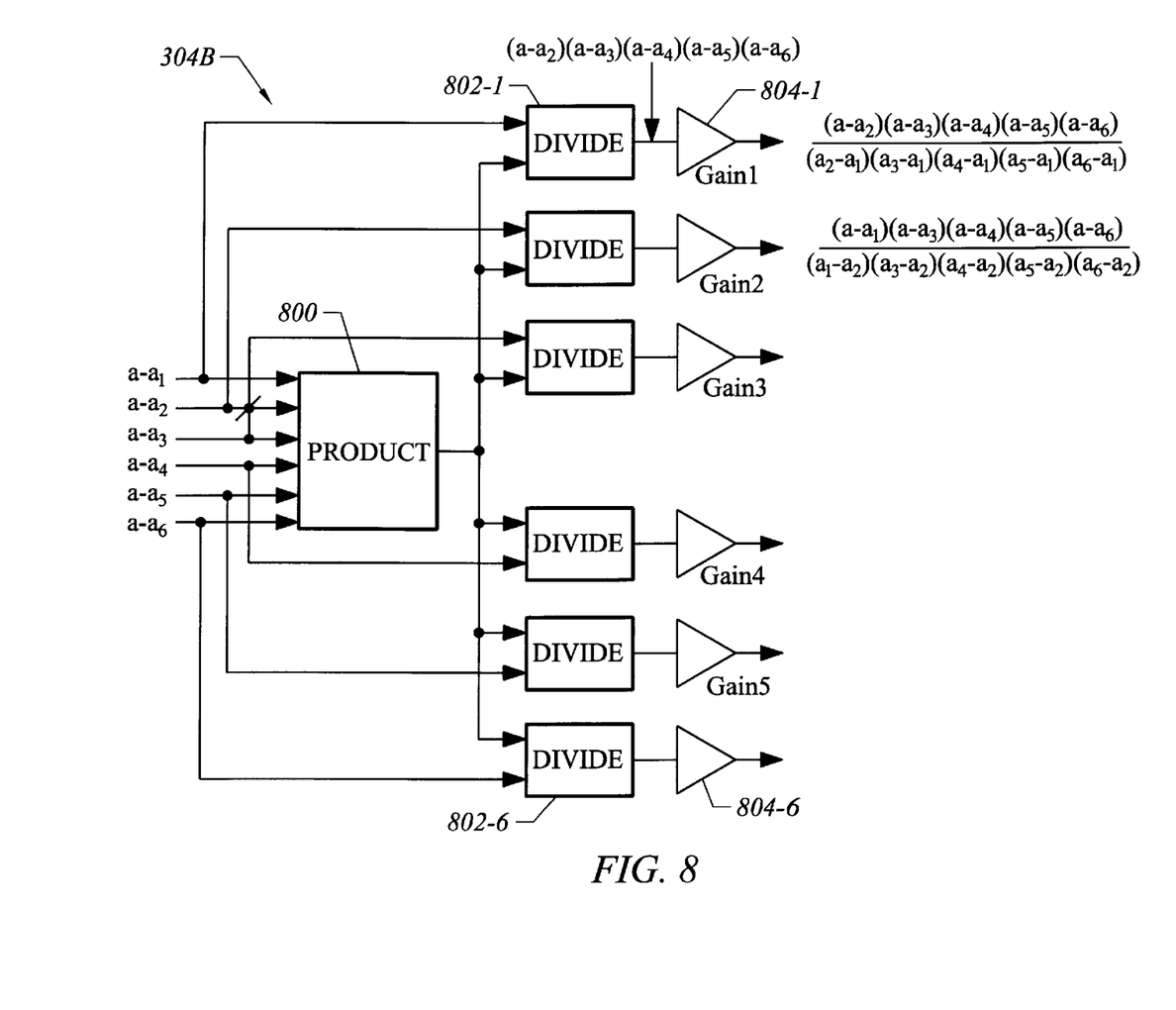
FIG. 8 illustrates an alternate quotient circuit that may be utilized in accordance with the module of FIG. 3.

FIG. 8 illustrates an alternate quotient circuit 304B that may be utilized in accordance with an embodiment of the invention. In this embodiment, all of the input signal difference values are applied to a single product block 800 to produce product terms. Each product term is divided by a different input signal difference value at blocks 802_1 through 802_6, thereby producing the required numerator expressions. Once again, gain blocks 804_1 through 804_6 are used to provide the required denominator expressions. This results in the same numerator-denominator expressions required in Equation 3. Output pins 804_1 and 804_2 illustrate two examples of such expressions in accordance with an embodiment of the invention. These expressions result in quotient values.

Figure 9:
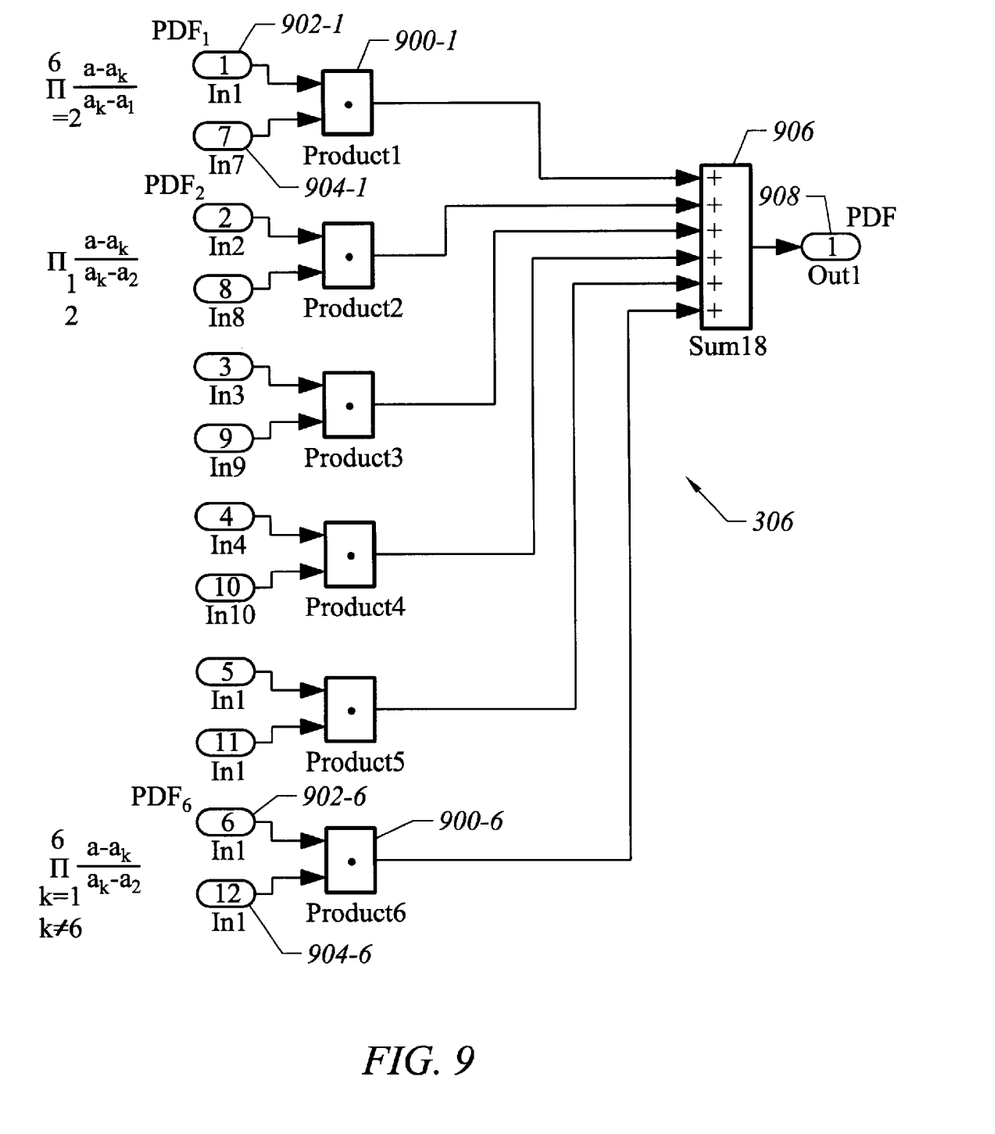
FIG. 9 illustrates a complex multiplication term summing circuit that may be utilized in accordance with the module of FIG. 3.

FIG. 9 illustrates a complex multiplication term summing circuit 306 configured in accordance with an embodiment of the invention. The complex multiplication term summing circuit 306 processes the recursive complex multiplication terms and the quotient values to generate the complex multiplication term. As shown in FIG. 9, the complex multiplication terms PDFi are applied to nodes 902_1 through 902_6. The quotient values are applied to nodes 904_1 through 904_6. The product blocks 900_1 through 900_6 produce the product term of Equation 3. These product terms are summed at summing block 906, which performs the summing operation of Equation 3. This processing results in the PDF(a) value of Equation 3.

Those skilled in the art will recognize a number of benefits associated with the invention. The invention provides dynamic pre-distortion without the expense and performance shortcomings associated with look-up tables. The Lagrange interpolation polynomials utilized in accordance with the invention approximate an inverse distortion function with a small number of data points. This approach allows for a dynamic update of sampling points and the interpolation of data between data points. An adjustment to the polynomial coefficients modifies the entire nonlinearity curve, thus the invention allows rapid dynamic modifications. The complexity of the device of the invention is linearly proportional to the degree of the polynomial utilized, thus efficient designs can be implemented with relatively low complexity.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. An apparatus for pre-distorting a signal, comprising:

input nodes to receive an in-phase input signal and a quadrature input signal;

feedback nodes to receive an in-phase feedback signal and a quadrature feedback signal;

output nodes to transmit an in-phase pre-distorted signal and a quadrature pre-distorted signal; and a Lagrange interpolation digital pre-distortion circuit connected to said input nodes, said feedback nodes, and said output nodes, said Lagrange interpolation digital pre-distortion circuit being configured to perform a Lagrange interpolation on said in-phase input signal, said quadrature input signal, said in-phase feedback signal, and said quadrature feedback signal to produce said in-phase pre-distorted signal and said quadrature pre-distorted signal wherein said Lagrange interpolation digital pre-distortion circuit includes an error circuit to produce an error signal between said in-phase input signal and said in-phase feedback signal and between said quadrature input signal and said quadrature feedback signal;

wherein said Lagrange interpolation digital pre-distortion circuit further comprises a Lagrange interpolation circuit to receive said error signal, said in-phase input signal, and said quadrature input signal and produce a complex multiplication term therefrom; and wherein said Lagrange interpolation digital pre-distortion circuit further comprises a complex multiplier to multiply said complex multiplication term by said in-phase input signal and said quadrature input signal to produce said in-phase pre-distorted signal and said quadrature pre-distorted signal.

2. The apparatus of claim 1 wherein said Lagrange interpolation circuit includes an input signal differencing circuit to generate input signal difference values from said in-phase input signal and said quadrature input signal.

3. The apparatus of claim 2 wherein said Lagrange interpolation circuit includes a coefficient adjustment module to process said input signal difference values and produce recursive complex multiplication terms.

4. The apparatus of claim 3 wherein said Lagrange interpolation circuit includes a quotient circuit to process said input signal difference values to produce quotient values.

5. The apparatus of claim 4 wherein said Lagrange interpolation circuit includes a complex multiplication term summing circuit to process said recursive complex multiplication terms and said quotient values to generate said complex multiplication term.

6. A method of pre-distorting a signal, comprising:

receiving an in-phase input signal, a quadrature input signal, an in-phase feedback signal, and a quadrature feedback signal;

performing a Lagrange interpolation on said in-phase input signal, said quadrature input signal, said in-phase feedback signal, and said quadrature feedback signal to produce an in-phase pre-distorted signal and a quadrature pre-distorted signal;

producing an error signal between said in-phase input signal and said in-phase feedback signal and between said quadrature input signal and said quadrature feedback signal;

producing a complex multiplication term from said error signal, said in-phase input signal, and said quadrature input signal; and multiplying said complex multiplication term by said in-phase input signal and said quadrature input signal to produce said in-phase pre-distorted signal and said quadrature pre-distorted signal.

7. The method of claim 6 further comprising generating input signal difference values from said in-phase input signal and said quadrature input signal.

8. The method of claim 7 further comprising processing said input signal difference values to produce recursive complex multiplication terms.

9. The method of claim 8 further comprising processing said input signal difference values to produce quotient values.

10. The method of claim 9 further comprising processing said recursive complex multiplication terms and said quotient values to generate said complex multiplication term.

* * * * *